United States Patent
Guyon et al.

(10) Patent No.: US 8,434,228 B2
(45) Date of Patent: May 7, 2013

(54) HEAT EXCHANGER AND A METHOD OF MANUFACTURING IT

(75) Inventors: Eric Guyon, La Mure (FR); Pierre Lecocq, Villard Saint Christophe (FR)

(73) Assignee: Ferraz Shawmut Thermal Management, La Mure (FR)

( * ) Notice: Subject to any disclaimer, the term of this patent is extended or adjusted under 35 U.S.C. 154(b) by 1099 days.

(21) Appl. No.: 12/224,721

(22) PCT Filed: Mar. 13, 2007

(86) PCT No.: PCT/FR2007/000431
§ 371 (c)(1),
(2), (4) Date: Mar. 4, 2009

(87) PCT Pub. No.: WO2007/104857
PCT Pub. Date: Sep. 20, 2007

(65) Prior Publication Data
US 2009/0178782 A1    Jul. 16, 2009

(30) Foreign Application Priority Data

Mar. 15, 2006    (FR) .................................... 06 02277

(51) Int. Cl.
*B21K 25/00* (2006.01)
(52) U.S. Cl.
USPC ............ 29/890.054; 29/505; 29/521; 29/890; 165/80.3
(58) Field of Classification Search ............. 29/890.054, 29/890, 505, 521, 525; 165/80.3
See application file for complete search history.

(56) References Cited

U.S. PATENT DOCUMENTS

| | | | | |
|---|---|---|---|---|
| 3,068,160 A * | 12/1962 | Erwin | | 29/462 |
| 3,404,061 A * | 10/1968 | Bochman et al. | | 428/143 |
| 5,014,776 A * | 5/1991 | Hess | | 165/185 |
| 5,542,176 A * | 8/1996 | Serizawa et al. | | 29/890.03 |
| 5,819,407 A * | 10/1998 | Terada | | 29/890.03 |
| 6,234,246 B1 * | 5/2001 | Bock et al. | | 165/185 |
| 6,520,248 B2 * | 2/2003 | Gailus et al. | | 165/80.3 |
| 6,749,010 B2 * | 6/2004 | Getz et al. | | 165/80.3 |
| 7,286,352 B2 * | 10/2007 | Curtis et al. | | 361/697 |
| 7,819,173 B2 * | 10/2010 | Zaghlol | | 165/80.3 |
| 7,827,688 B2 * | 11/2010 | Chen | | 29/890.03 |
| 2002/0043359 A1 * | 4/2002 | Mizutani | | 165/80.3 |
| 2004/0000391 A1 | 1/2004 | Getz et al. | | |
| 2004/0001317 A1 | 1/2004 | Getz et al. | | |
| 2004/0134646 A1 | 7/2004 | Chu et al. | | |
| 2005/0167085 A1 * | 8/2005 | Chu et al. | | 165/80.3 |

FOREIGN PATENT DOCUMENTS

| | | |
|---|---|---|
| CN | 1522811 | 8/2004 |
| WO | WO 03/052340 | 6/2003 |

* cited by examiner

*Primary Examiner* — Alexander P Taousakis
(74) *Attorney, Agent, or Firm* — Dowell & Dowell, PC

(57) ABSTRACT

A heat exchanger including a metal base formed of a plurality of interfitted elements and fins formed in part from recompressed expanded graphite, wherein the fins are securely connected to the base by placing a deformable edge portion of each fin between each pair of interfitting elements and thereafter compressing the interfitting elements toward one another to deformably retain the edge portions of each fin there between.

7 Claims, 3 Drawing Sheets

HEAT EXCHANGER AND A METHOD OF MANUFACTURING IT

BACKGROUND OF THE INVENTION

1. Field of the Invention

The invention relates to a method of manufacturing a heat exchanger designed to cool at least one power electronic component. The invention also relates to such a heat exchanger.

2. Brief Description of the Related Art

Heat exchangers are used conventionally to avoid detrimental overheating of power electronic components, such as Insulated Gate Bipolar Transistor (IGBT) circuits or equivalent equipments. As described in Document FR-A-2 777 986, such a heat exchanger can comprise a plate on which tubes are mounted through which a coolant fluid circulates. As envisaged in US-A-2004/0000391, such a heat exchanger can further comprise a metal base on which graphite fins are mounted, those fins being engaged in grooves that are machined in the base. Even when a friction fit is used, the mechanical fastening of those fins is not permanent, in particular insofar as the successive increases in the temperature of the base give rise to variations in the dimensions thereof that do not correspond to the changes in the fins. Therefore, the thermal contact between the fins and the base tends to deteriorate over time, which adversely affects the overall effectiveness of the heat exchanger.

When making a heat exchanger that comprises a metal base, and fins of high thermal conductivity (expressed in watts per meter degree Celsius (W/m° C.)), a problem arises concerning how to fasten together the various elements of different natures. The fins can be assembled mechanically onto the base, with the above-mentioned drawbacks, by brazing or by adhesive bonding. Fastening by brazing guarantees heat transfer that is of good quality, which is desirable in applications in which maximum cooling effectiveness is desired. However, that solution suffers from the drawback of requiring coatings to be applied to the parts that are to be assembled prior to assembly thereof, those coatings often being costly in view of the uses for which they are designed. In addition, the nature of certain fin materials does not make it possible to accommodate such treatments and/or to withstand the increase in temperature resulting from the brazing. Adhesive bonding is sometimes applied. In which case, the thermal improvement procured by the material of the fin is, for the most part, lost in the adhesive bond in which the thermal conductivity of the products used is very low.

SUMMARY OF THE INVENTION

More particularly, an object of the invention is to remedy those drawbacks by proposing a method of manufacturing a heat exchanger that makes it possible to fasten the fins to the base optimally, both in mechanical terms and in thermal terms.

To this end, the invention provides a method of manufacturing a heat exchanger designed to cool at least one power electronic component, the heat exchanger comprising a metal base and fins, each of said fins has a portion made of recompressed expanded graphite, said method being characterized in that it comprises a step consisting in:

a) embedding an edge of at least one fin by squeezing a deformable portion between two distinct component pieces of the base.

Thanks to the invention, the deformable portion is compressed between the two component pieces of the base, so that it holds the fin stationary mechanically and establishes optimized thermal contact between the base and the fin.

In advantageous but optional aspects of the invention, such a method can incorporate one or more of the following characteristics:

It further comprises a step b) prior to step a) and in which the deformable portion is formed by making provision for the edge of the fin to have a thickness that is greater than the thickness of the portion of the fin that is designed to project relative to the base. At the end of step b), the thickness of the deformable edge is advantageously greater by in the range 20% to 40% than the thickness of the portion of the fin that is designed to project relative to the base.

It further comprises a step b') prior to step a) and in which the deformable portion is formed as an independent part and then said part is disposed in the vicinity of the edge of the fin, between the pieces of the base. During step b'), the deformable portion is formed with a generally channel-section shape, suitable for capping the edge of the fin.

During step b) or b'), the deformable portion is provided with a height substantially equal to the height of embedding of the fin between the above-mentioned pieces of the base.

The invention also relates to a heat exchanger suitable for being manufactured by the above-mentioned method, and more specifically to a heat exchanger comprising a metal base and fins, each of said fins has a portion made of recompressed expanded graphite, said heat exchanger being characterized in that the base is made up of a plurality of distinct pieces between at least two of which an edge of a fin is embedded, a portion of the fin being deformed by being squeezed between the two above-mentioned pieces of the base, at the edge of the fin.

In advantageous but optional aspects of the invention, such a heat exchanger can incorporate one or more of the following characteristics:

The deformed portion is constituted by the edge of the fin, which edge is integral with the portion of the fin that projects relative to the base.

The deformed portion is a part that is interposed between the edge of the fin and at least one of the pieces of the base between which the edge is embedded.

The zones in which two adjacent pieces of the base meet have profiles with crenellations suitable for interfitting with one another, the deformed portion being disposed between two end zones of said profiles.

BRIEF DESCRIPTION OF THE DRAWINGS

The invention can be better understood and other advantages of the invention appear more clearly from the following description of two embodiments of a heat exchanger that complies with the principle and with the manufacturing method of the invention, the description being given merely by way of example and with reference to the accompanying drawings, in which.

DESCRIPTION OF THE PREFERRED EMBODIMENTS

Figure 1:
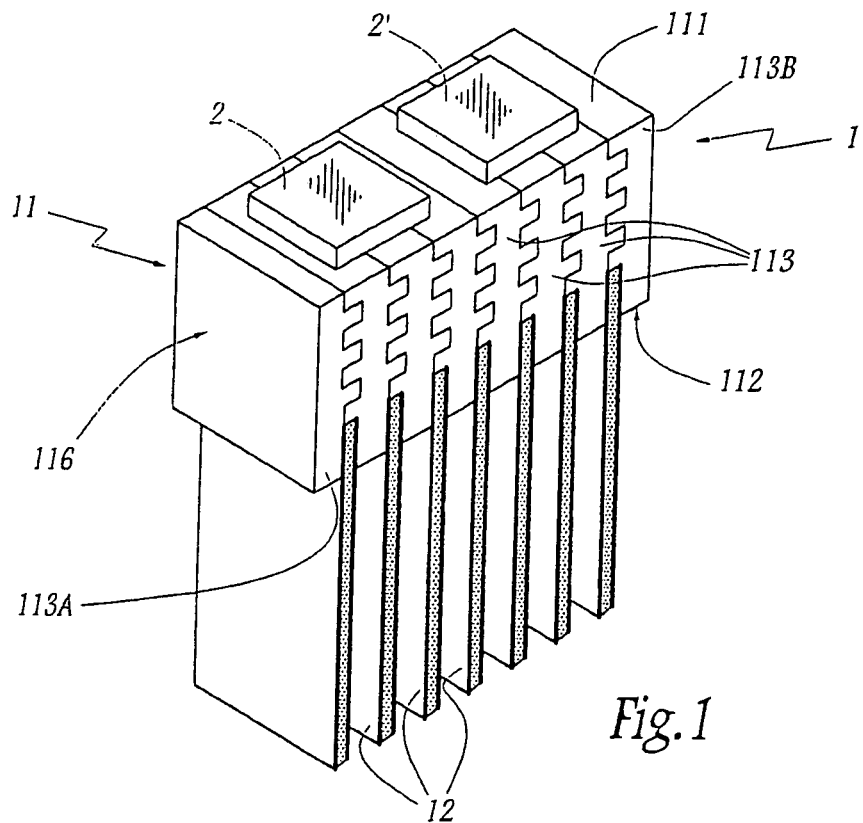
FIG. 1 is a perspective view of a heat exchanger of the invention equipping two electronic components.

The heat exchanger 1 shown in FIGS. 1 to 4 comprises a base 11 that is generally rectangular block shaped and on which fins 12 are mounted that enable heat to be dissipated into the ambient atmosphere, which heat is transmitted to the base 11 by two electronic components 2 and 2' that are mounted on that face 111 of the base 11 that is opposite from the face 112 from which the fins 12 extend.

The base 11 is made by assembling together extruded aluminum elements 113 that are identical, except for the end elements 113A and 113B. In a variant, the end elements can be identical to the other elements 113, in which case, the small end faces 116 and 117 of the base 11 are ribbed.

The elements 113, 113A, and 113B of the base 11 are distinct parts that must be assembled together to form said base.

Each of the sides of the elements 113 has a profile with crenellations formed of a succession of grooves 114 and of ribs 115 that extend parallel to the end faces 116 and 117 of the base 11, which faces are defined by respective ones of the elements 113A and 113B. The grooves 114 and ribs 115 of the various elements 113 are disposed in such a manner that they can interfit with and be wedged in the grooves and ribs of an adjacent element 113 when the base 11 is assembled. In other words, the crenellated profiles provided on the two sides of the same element 113 are complementary with each other over most of the height $H_{113}$ of each element 113 that extends between the faces 111 and 112.

In the vicinity of the face 112, the crenellated profiles are not exactly complementary, so that there remains, after assembly of the base 11 and between two adjacent elements 113, a recess 118 for receiving a root 121 of a fin 12, which root constitutes the edge of the fin that is held stationary by being embedded between facing faces 119 and 119' of two elements 113 whose crenellated profiles are co-operating with each other. In other words, the surfaces 119 and 119' co-operate to define a recess 118 between them.

With the exception of the elements 113A and 113B, each element 113 is provided both with a surface 119 and with a surface 119', which surfaces are distributed on either side of a midplane $P_{113}$ of said element.

Figure 3:
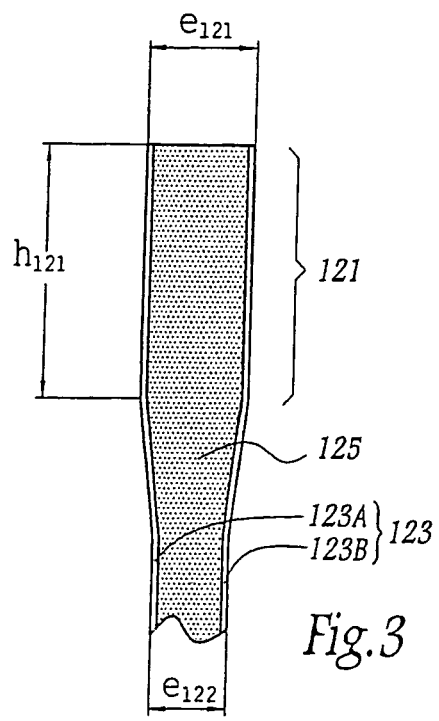
FIG. 3 is a view on a larger scale of the detail III of FIG. 2.
Figure 2:
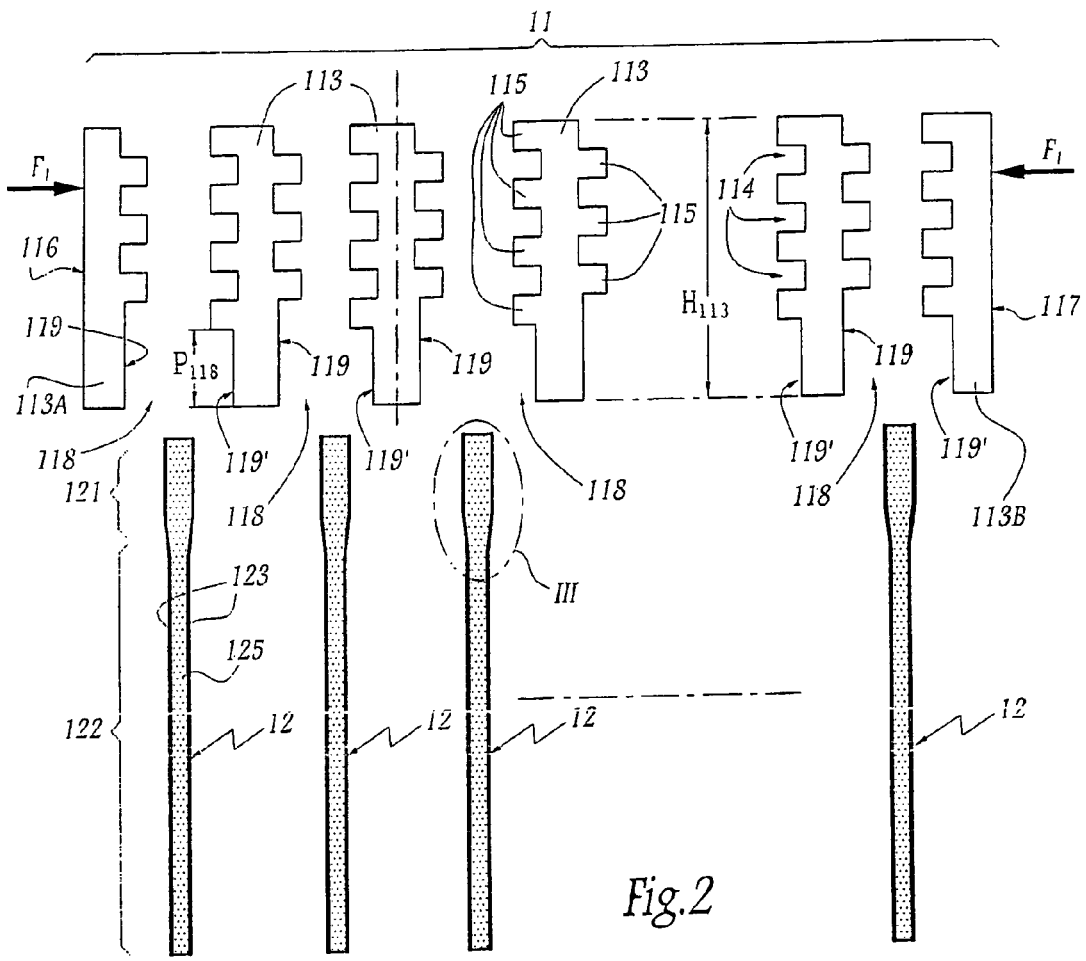
FIG. 2 is a diagrammatic side view of the heat exchanger of FIG. 1 while it is being manufactured.
Figure 4:
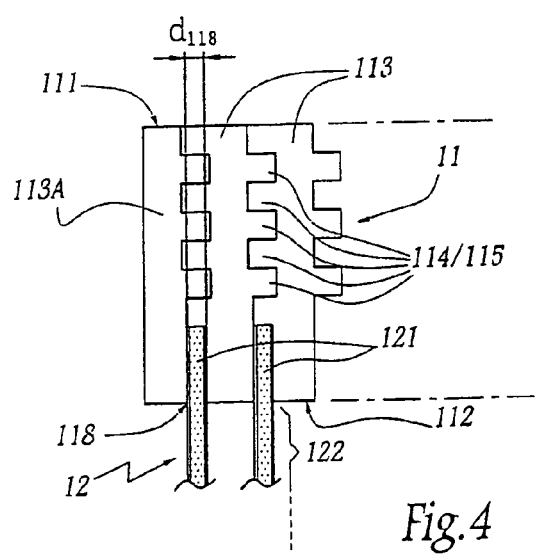
FIG. 4 is a fragmentary side view of the heat exchanger of FIG. 1.

As can be seen more particularly in FIG. 3, before the fin 12 is mounted onto the base 11, its root 121 has a thickness $e_{121}$ that is greater than the thickness $e_{122}$ of the portion 122 of the fin 12 that is designed to project beyond the face 112 of the base 11 once the heat exchanger 1 is assembled. The root 121 is integral with the portion 122. In practice, the thickness $e_{121}$ is greater than the thickness $e_{122}$ by in the range 20% to 40%. For example, the thickness $e_{121}$ can be about 2 millimeters (mm) while the thickness $e_{122}$ is about 1.6 mm.

While a fin 12 is being manufactured, the root or deformable edge 121 is shaped to have the thickness $e_{121}$ over a height $h_{121}$ that is substantially equal to the depth $P_{118}$ of the recess 118 into which it is designed to be inserted, said depth being equal to the height of the surface 119' as measured perpendicularly to the faces 111 and 112.

Each fin 12 is formed of a core 125 made from a plate of recompressed expanded graphite also commonly known as "flexible graphite", said core being clad with cladding 123 made up of two metal foil strips of aluminum 123A and 123B disposed against the side faces of the fin 12, which foil strips impart to the fin both good strength and also a certain amount of flexibility, enabling said fin to deform. The core 125 and the foil strips 123A and 123B can be fastened together by mechanical anchoring and co-lamination.

When manufacturing the heat exchanger 1, the root 125 of a fin 12 is inserted between the facing faces 119 and 119' of each pair of elements 113. Then the base 11 is assembled by exerting on the faces 116 and 117 a clamping force represented by the arrows $F_1$ in FIG. 2, until the ribs 115 are fully embedded in the corresponding grooves 114, the recesses 118 thus being formed. The base 11 is then held in this configuration by means of the tight mutual interfitting of the crenellations of the elements 113.

Thus, by forming the base 11, by assembling together the elements 113, 113A and 113B and by clamping them together more tightly, the root 121 of each fin 112 is held stationary by it being compressed in a recess 118. The force squeezing the root 121 is exerted by the elements 113, 113A, or 113B when they are clamped.

Due to the tighter clamping obtained by the force $F_1$, each root 121 is deformed by being squeezed while being embedded in the corresponding recess 118. The depth of the grooves 114 and the height of the ribs 115 are chosen in such a manner that the distance $d_{118}$ between the facing faces 119 and 119' of a recess 118 is substantially equal to the thickness $e_{122}$.

In view of the capacity of the flexible graphite core 125 to be compressed without breaking, the result of the fins 12 and the base 11 being assembled together mechanically by means of embedding is that the various fins 12 are held mechanically in effective manner, and that thermal contact is established in very satisfactory manner between the base 11 and the fins 12.

In practice, in an aspect of the invention that is not shown, the thicknesses of the ribs 115 and of the grooves 114 guarantee that, after the elements 113 have been assembled together and by means of the force $F_1$, the ribs 115 are fully embedded in the grooves 114, thereby imparting to the resulting base a mechanical structure that is very rigid and non-separable.

The elements 113 can be obtained by extrusion, with manufacturing tolerances that are taken up during assembly of the base 11, by the embedding of the fins 12. No brazing is necessary in order to hold the fins 12 permanently on the base 11, which is very advantageous in view of the nature of the core 125 of each fin 12.

By way of example, the thickness $e_{121}$ can be about 2 mm, while the distance $d_{118}$ lies approximately in the range 1.6 mm to 1.9 mm. In which case, when the root 121 is embedded, its thickness is reduced by an amount lying in the range 5% to 20%.

Figure 6:
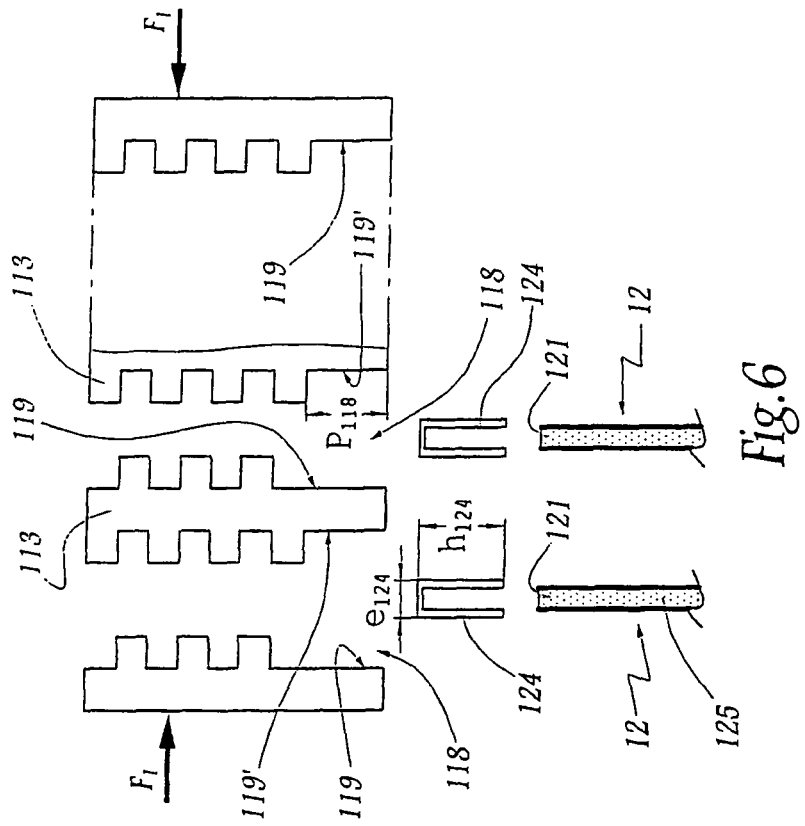
FIG. 6 is a fragmentary diagrammatic side view of the heat exchanger of FIG. 5 while it is being manufactured.
Figure 5:
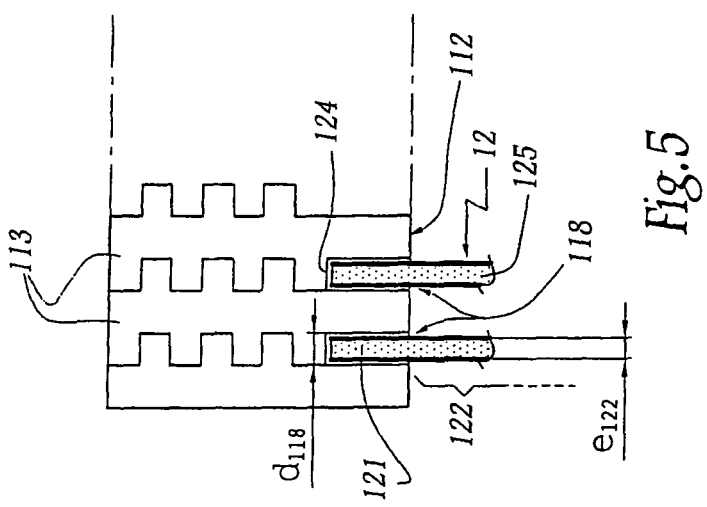
FIG. 5 is a view analogous to the FIG. 4 view for a second embodiment of the heat exchanger of the invention.

In the second embodiment of the invention shown in FIGS. 5 and 6, elements that are analogous to the elements of the first embodiment bear identical references. In the second embodiment, the base 11 is formed by assembling together aluminum shaped-section elements 113. Each of the fins 12 is formed of a core 125 and of metal cladding 123. They have the same thickness over their entire height. Deformable bushes 124 are provided as parts that are structurally independent of the pieces 11 and 12 of the heat exchanger 1 prior to assembly thereof. These parts 124 are in the form of generally U or channel-section troughs, enabling each of them to cap the edge 121 of a respective fin 12, the parts 124 being inserted into recesses 118 defined, as in the first embodiment, in the vicinity of one face 112 of the base 11, between two facing faces 119 and 119' belonging to respective ones of two different elements 113.

In the second embodiment, the parts 124 play the same part as the deformable roots 121 of the first embodiment in that they are designed to deform by being squeezed under the effect of the clamping force exerted for assembling the base 11. These parts 124 both hold the fins 12 stationary mechanically relative to the base 11, and also establish excellent thermal contact between the fins 12 and the base 11.

The parts 124 can be made of any material suitable for their function, in particular of metal foil strips, e.g. made of copper or of aluminum. They are preferably made of recompressed expanded graphite, also known as "flexible graphite", like the cores 125 of the fins 12.

The total thickness of a part 124 before it is inserted between two elements 113 is referenced $e_{124}$. This thickness is reduced while the heat exchanger is being manufactured, due to the compression obtained by the clamping force $F_1$ exerted during assembly of the base 11. In this situation, the distance $d_{118}$ between the facing faces 119 and 119' of a recess 118 is not equal to the thickness $e_{122}$ of a fin 12 in its portion 122 that projects beyond the base 11, given that the flanges of the channel section formed by each part 124 continue to have some thickness.

The height $h_{124}$ of each part 124 is at least equal to the depth $P_{118}$ of the recesses 118.

Thus, when forming the base 11 by assembling together the pieces 113 and equivalent pieces, the fins 12 are held stationary in the recesses 118 by compressing the parts 124, by means of the elements 113 and equivalent elements, to the extent that said parts deform.

In a variant of the invention that is not shown, a part forming a deformable portion can be disposed on one side only of a fin 12 in the corresponding recess 118, namely either on the same side as the surface 119, or on the same side as the surface 119' of the corresponding recess 118. In another variant, a part can be disposed on either side of the portion of the fin 112 that is embedded in a recess 118, without the two parts being connected together by a piece corresponding to the web of the U or channel section shown in FIG. 6.

Regardless of the embodiment, the foil-strip cladding can be omitted, the fins then being made of graphite only.

In another variant, the cores 125 or the entire fins 12, when cladding is omitted, can be made of a mixture comprising graphite and another material, such as a binder.

The invention claimed is:

1. A method of manufacturing a heat exchanger designed to cool at least one power electronic component, the heat exchanger comprising a metal base having a plurality of interfitting elements each of which interfits with an opposing interfitting element and fins, each of said fins has a portion made of recompressed expanded graphite and a compressible edge portion, the method comprising the steps of:
   a) placing the compressible edge portion of at least one fin between two opposing interfitting elements of the base; and
   b) thereafter compressing the two opposing interfitting elements toward one another so as to force the interfitting elements together to thereby squeeze and deformably secure the compressible edge portion of the at least one fin between the opposing interfitting elements of the base.

2. The method according to claim 1, including a step prior to step a) of:
   forming the compressible edge portion to have a thickness that is greater than a thickness of a portion of the fin that is designed to project relative to the base.

3. The method according to claim 2, including forming the compressible edge portion to be 20% to 40% greater in thickness than the thickness of the portion of the fin that is designed to project relative to the base.

4. The method according to claim 2, including forming the compressible edge portion with a height substantially equal to a height of embedding of the fin between the opposing interfitting elements of the base.

5. A method according to claim 1, including during step a):
   placing a separate part along the compressible edge portion and between the two opposing interfitting elements so that the separate part is compressed with the compressible edge portion between the interfitting elements of the base during step b).

6. The method according to claim 1, including a step, prior to step a) of forming a generally channel-section shape part of a size and configuration for capping the compressible edge portion of the fin and, during step a) placing compressible edge portion between the interfitting elements with the part capped along the compressible edge portion so that the part is compressed with the compressible edge portion between the interfitting elements of the base during step b).

7. The method of claim 1 including prior to step a), of forming each interfitting element to have alternating ribs and grooves extending from at least one side thereof which are of a size and configuration to interfit with alternating ribs and grooves of an opposing interfitting element.

\* \* \* \* \*